(12) United States Patent
Masui et al.

(10) Patent No.: US 8,040,934 B2
(45) Date of Patent: Oct. 18, 2011

(54) VERTICAL CAVITY SURFACE EMITTING LASER AND METHOD OF MANUFACTURING THEREOF

(75) Inventors: Yuji Masui, Kanagawa (JP); Takahiro Arakida, Kanagawa (JP); Terukazu Naruse, Kanagawa (JP); Rintaro Koda, Tokyo (JP); Naoki Jogan, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/656,166

(22) Filed: Jan. 20, 2010

(65) Prior Publication Data

US 2010/0202486 A1 Aug. 12, 2010

(30) Foreign Application Priority Data

Feb. 6, 2009 (JP) ................... 2009-026675

(51) Int. Cl.
*H01S 5/00* (2006.01)
*H01S 3/00* (2006.01)

(52) U.S. Cl. ............... 372/50.124; 372/29.013

(58) Field of Classification Search ............. 372/50.124, 372/29.013

See application file for complete search history.

(56) References Cited

U.S. PATENT DOCUMENTS

| 7,675,956 B2 * | 3/2010 | Maeda et al. ............. 372/50.124 |
| 7,738,526 B2 * | 6/2010 | Onishi ..................... 372/50.124 |
| 2007/0120133 A1 | 5/2007 | Koda et al. |
| 2008/0056321 A1 | 3/2008 | Motomura et al. |
| 2009/0052490 A1 * | 2/2009 | Maeda et al. ............. 372/50.11 |

FOREIGN PATENT DOCUMENTS

| JP | 06-318760 A | 11/1994 |
| JP | 11-004038 A | 1/1999 |
| JP | 2001-085788 A | 3/2001 |
| JP | 2002-289912 | 10/2002 |
| JP | 2003-110196 A | 4/2003 |
| JP | 2007-150193 | 6/2007 |
| JP | 2007-194247 A | 8/2007 |
| JP | 2008-060322 | 3/2008 |

OTHER PUBLICATIONS

Japanese Office Action issued Dec. 28, 2010 for corresponding Japanese Application No. 2009-026675.

* cited by examiner

*Primary Examiner* — Jessica Stultz
*Assistant Examiner* — Phillip Nguyen
(74) *Attorney, Agent, or Firm* — Rader, Fishman & Grauer PLLC (57) ABSTRACT

A vertical cavity surface emitting laser capable of reducing parasitic capacitance while suppressing power consumption, and a method of manufacturing thereof are provided. The vertical cavity surface emitting laser includes a columnar mesa including, on a substrate, a first multilayer reflector, an active layer, and a second multilayer reflector in order from the substrate side, and also including a current narrowing layer. The columnar portion of the mesa including the active layer and the current narrowing layer is formed within a region opposed to the first multilayer reflector and a region opposed to the second multilayer reflector, and a cross section area of the columnar portion is smaller than a cross section area of the second multilayer reflector.

5 Claims, 13 Drawing Sheets

VERTICAL CAVITY SURFACE EMITTING LASER AND METHOD OF MANUFACTURING THEREOF

BACKGROUND OF THE INVENTION

1. Field of the Invention

The present invention relates to a vertical cavity surface emitting laser (VCSEL) with small parasitic capacitance and method of manufacturing thereof.

2. Description of the Related Art

In recent years, a VCSEL is used as a reasonable light source for optical communication because its power consumption is low compared with an edge-emitting laser diode and direct modulation is available.

The VCSEL in general is provided with a columnar mesa including a lower DBR layer, a lower spacer layer, an active layer, an upper spacer layer, an upper DBR layer, and a contact layer in order on a substrate. Either one of the lower DBR layer and the upper DBR layer includes a current narrowing layer where the current injection region is narrowed in order to raise the efficiency of current injection into the active layer and decrease threshold current. An electrode is disposed on each of the top surface of the mesa and the rear surface of the substrate. In the semiconductor laser, electrical current injected from the electrode is narrowed through the current narrowing layer and injected into the active layer to recombine electrons and holes, thereby emitting lights. The light is reflected by the lower DBR layer and the upper DBR layer to produce a laser oscillation at a predetermined wavelength, and is emitted outside through the top surface of the mesa as a laser beam.

SUMMARY OF THE INVENTION

In order to perform high speed modulation in the above-mentioned semiconductor laser, reduction of parasitic capacitance is necessary. Parasitic capacitance is produced mainly in an oxidized narrowed layer or a pn junction within the mesa. To reduce parasitic capacitance caused by those portions, reduction of mesa diameter may have some effect, for example. However, since a ring electrode is formed on the top surface of the mesa, the mesa diameter is limited by the diameter of the oxidized narrowed layer, the width of the ring electrode, the positional accuracy at the time of forming the ring electrode and so on. For example, when the oxidized narrowed layer is defined as 10 μm in diameter, the ring electrode is defined as 5 μm in width, and the positional accuracy is defined as ±2 μm, the mesa diameter needs to be not less than (10+5*2+2)*2=24 μm.

To avoid the influence of the ring electrode exerted on the mesa diameter, the semiconductor laser of a bottom surface emitting type as described in Japanese Unexamined Patent Application Publication No. 2008-060322 may be employed. Since such a bottom surface emitting laser diode allows the electrode to be formed on the whole surface including the top surface of the mesa, the mesa diameter is determined irrespective of the electrode. However, such a bottom surface emitting type has a disadvantage in that a reduction of the mesa diameter causes higher electrical resistance in the mesa and large increase in power consumption.

It is desirable to provide a VCSEL capable of reducing parasitic capacitance while suppressing power consumption, and a method of manufacturing thereof.

A VCSEL according to an embodiment of the present invention includes a columnar mesa having, on a substrate, a first multilayer reflector, an active layer, and a second multilayer reflector in order from the substrate side, and also having a current narrowing layer. A columnar portion of the mesa including the active layer and the current narrowing layer is formed within a region opposed to the first multilayer reflector and a region opposed to the second multilayer reflector, and the cross section area of the columnar portion is smaller than the cross section area of the second multilayer reflector.

In the VCSEL according to an embodiment of the present invention, the columnar portion of the mesa including the active layer and the current narrowing layer is formed within a region opposed to the first multilayer reflector and a region opposed to the second multilayer reflector. Furthermore, the cross-section area of the columnar portion is smaller than the cross-section area of the second multilayer reflector. With such a configuration, parasitic capacitance caused by the active layer and the current narrowing layer may be reduced. What is more, electrical resistance in the mesa may be reduced compared with the case where the diameter of the entire mesa is small.

A method of manufacturing a VCSEL according to an embodiment of the present invention includes three steps (A) to (C) as follows:

(A) a first step of forming a plurality of grooves each reaching at least a second multilayer reflector and a layer to be oxidized at a predetermined interval in a direction rotative about a specific region. The specific region is a columnar portion within a substrate to be processed, which is constituted from a semiconductor layer including, on a first substrate, a first multilayer reflector, an active layer and a second multilayer reflector in order from a side opposite to the first substrate and the layer to be oxidized;

(B) a second step of forming a first metal layer on a top surface of the semiconductor layer where the grooves are not formed, and thereafter, bonding the first metal layer to a second metal layer of a supporting substrate constituted from a second substrate and the second metal layer provided on the second substrate; and (C) a third step of removing entirely or partially a portion other than a region including the specific region from the first substrate side to allow the grooves to communicate with outside, and thereafter, oxidizing the layer to be oxidized from side-faces of the grooves to form an oxidized region in the layer to be oxidized corresponding to an outer edge portion of the specific region, and to form an unoxidized region in the layer to be oxidized corresponding to a center portion of the specific region.

In the method of manufacturing the VCSEL according to an embodiment of the present invention, the supporting substrate is bonded to a surface plane of the substrate to be processed on the side toward which each groove is opened, where the substrate to be processed includes the semiconductor layer on the first substrate, and the grooves are formed at a predetermined interval around the specific region. Then, the region other than the region including the specific region is entirely or partially removed from the first substrate side, thereby allowing the grooves to communicate with outside. At this time, the first columnar portion of the specific portion that includes the active layer and the layer to be oxidized is formed within a region opposed to a second columnar portion of the first multilayer reflector surrounded by the plurality of grooves, and within a region opposed to a third columnar portion of the second multilayer reflector surrounded by the plurality of grooves. Furthermore, the cross-section area of the first columnar portion is smaller than the cross-section area of the third columnar portion. Here, the diameter of the specific region is determined previous to the step of allowing the grooves to communicate with outside, and it is not limited by the diameter of the unremoved region (region including the specific region) in the groove communication step. Accordingly, the cross-section area of the first columnar portion may be decreased irrespective of the third columnar portion.

According to the VCSEL of the embodiment of the invention, since the cross-section area of the columnar portion is smaller than the cross-section area of the second multilayer reflector, parasitic capacitance caused by the active layer and the current narrowing layer may be reduced. Moreover, electrical resistance in the mesa may be reduced and power consumption suppressed compared with the case where the diameter of the entire mesa is small. Therefore, in the embodiment of the present invention, parasitic capacitance may be reduced while suppressing power consumption.

According to the method of manufacturing the VCSEL of the embodiment of the present invention, since the cross-section areas of the active layer and the layer to be oxidized may be decreased irrespective of the third columnar portion, parasitic capacitance caused by the first columnar portion may be reduced. Moreover, since the cross-section area of the third columnar portion may be enlarged regardless of the first columnar portion, electrical resistance in the mesa may be reduced and power consumption may be suppressed compared with the case where the diameter of the entire mesa is small. As a result, in the embodiment of the present invention, parasitic capacitance may be reduced while suppressing power consumption.

Other and further objects, features and advantages of the invention will appear more fully from the following description.

DESCRIPTION OF THE PREFERRED EMBODIMENTS

Figure 1:
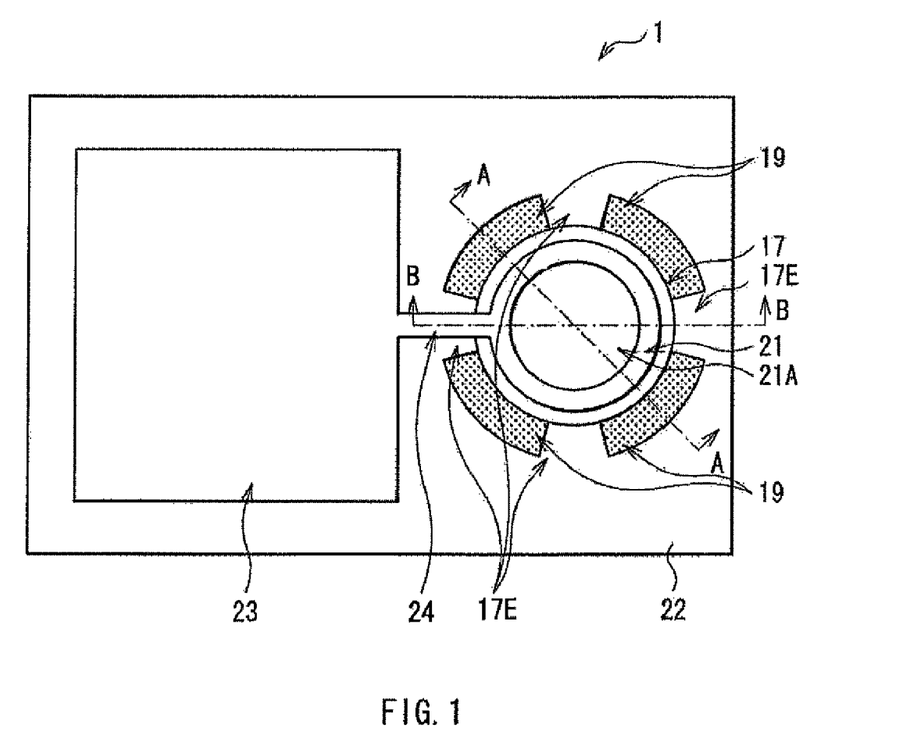
FIG. 1 is a top view of a laser diode according to an embodiment of the present invention.
Figure 2:
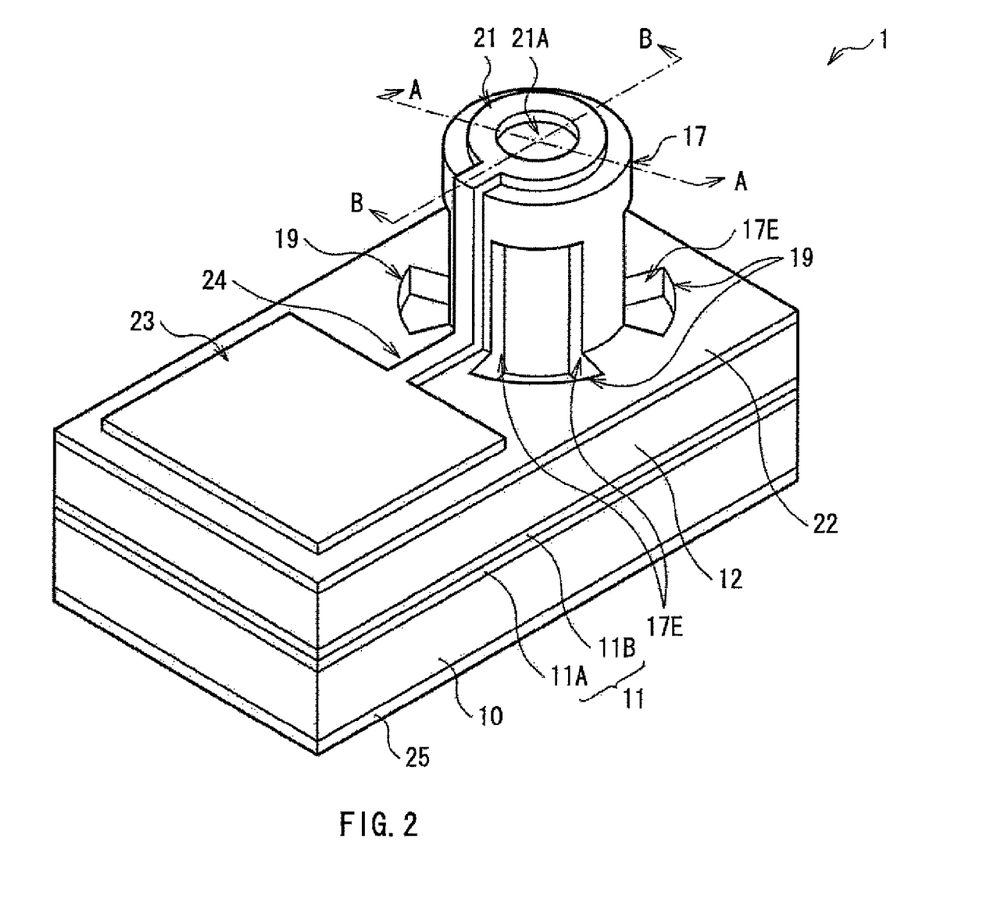
FIG. 2 is a perspective view of the laser diode of FIG. 1.
Figure 3:
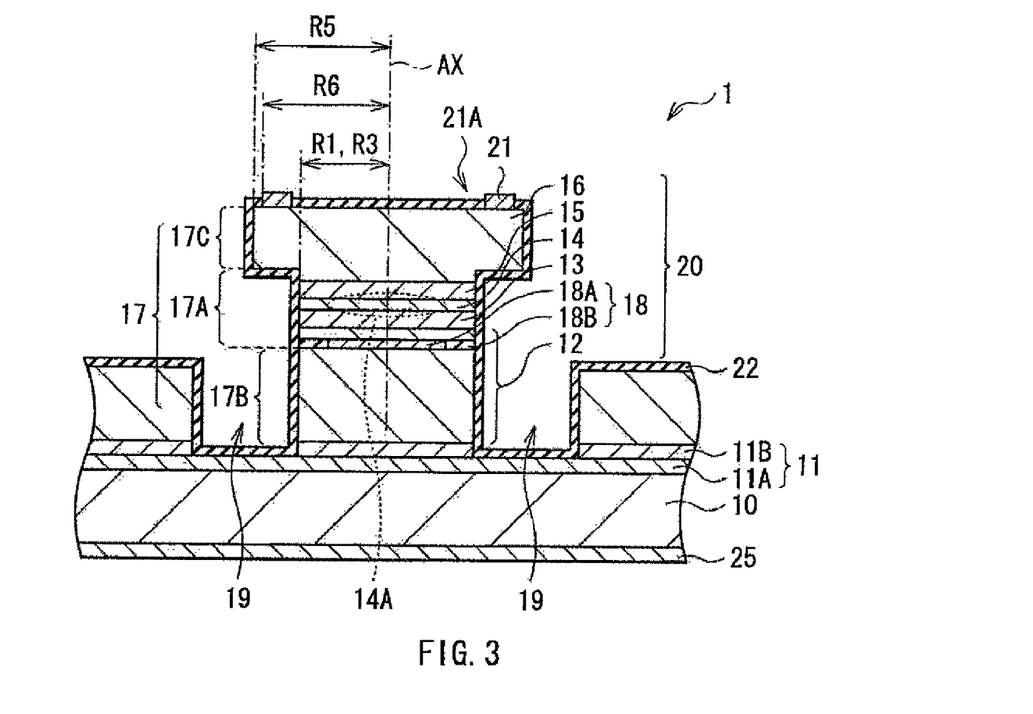
FIG. 3 is a sectional view of the laser diode of FIG. 1 as seen from the direction indicated by arrows A-A.
Figure 4:
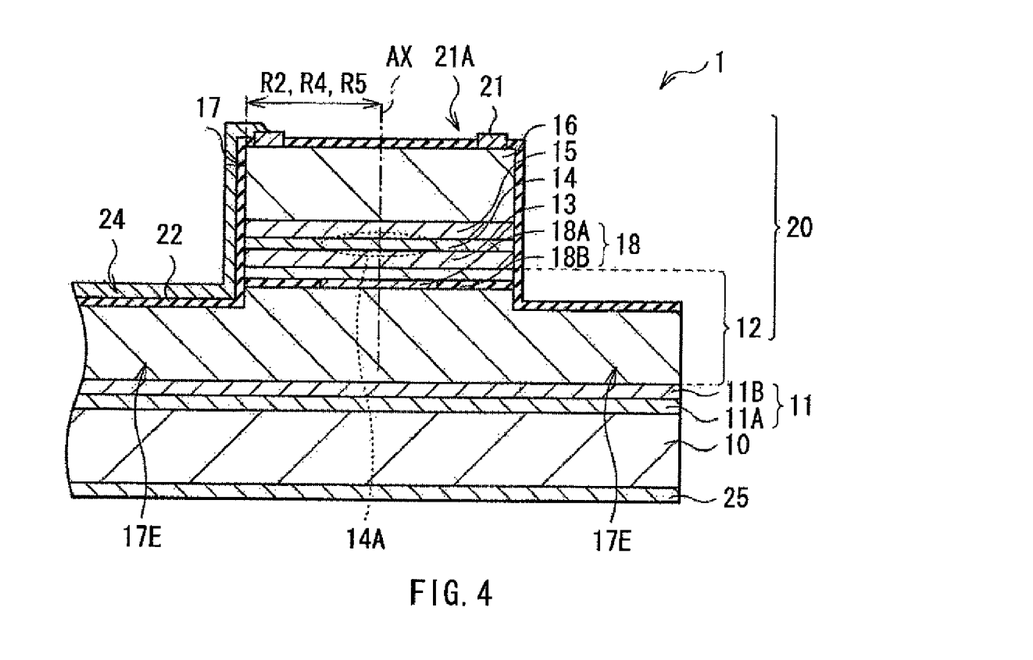
FIG. 4 is a sectional view of the laser diode of FIG. 1 as seen from the direction indicated by arrows B-B.

Embodiments of the invention will be described in detail hereinbelow with reference to the drawings. Explanation goes according to the following order:
1. Configuration
2. manufacturing process
3. Operation and Effect
4. Modification
Configuration FIG. 1 is a top view of a VCSEL 1 according to an embodiment of the present invention. FIG. 2 is a perspective view of the semiconductor laser of FIG. 1. FIG. 3 illustrates an example of a cross-sectional configuration of the semiconductor laser 1 of FIGS. 1 and 2 as seen from the direction indicated by arrows A-A. FIG. 4 illustrates an example of a cross-sectional configuration of the semiconductor laser 1 of FIGS. 1 and 2 as seen from the direction indicated by arrows B-B. It is to be noted that FIGS. 1 to 4 are just typically illustrated, and are not exactly equal to the actual dimension and configuration.

In the semiconductor laser 1 of the present embodiment, a metal layer 11 is formed on one side of a substrate 10. The metal layer 11 has a stack structure in which metal layers 11A and 11B are stacked in this order from the substrate 10 side. A stack structure 20 including a lower DBR layer 12, a lower spacer layer 13, an active layer 14, an upper spacer layer 15 and an upper DBR layer 16 (second multilayer reflector) in this order is formed on the metal layer 11. The stack structure 20 constitutes a columnar (cylindrical) mesa 17. Detailed description of the mesa 17 will be followed later.

In the embodiment, the lower DBR layer 12 corresponds to a specific example of "first multilayer reflector" of the present invention. The upper DBR layer 16 corresponds to a specific example of "second multilayer reflector" in the present invention. The stack structure 20 corresponds to a specific example of "semiconductor layer" in the present invention. The substrate 10 having the metal layer 11A thereon corresponds to a specific example of "supporting substrate" in the present invention. The metal layer 11A corresponds to a specific example of "second metal layer" in the present invention. The metal layer 11B corresponds to a specific example of "first metal layer" in the present invention.

The substrate 10 is an n-type GaAs substrate, for example. Examples of the n-type impurity include silicon (Si) and selenium (Se). The stack structure 20 is each formed of an AlGaAs-based compound semiconductor, for example. Here, the AlGaAs-based compound semiconductor means a compound semiconductor which contains at least aluminum (aluminum) and gallium (Ga) from among the elements of the 3B group in the short format periodic table of the elements and at least arsenic (As) from among the elements of the 5B group in the short format periodic table of the elements.

The metal layers 11A and 11B are disposed to bond the substrate to be processed 100 and the supporting substrate 200 each other in a manufacturing process to be described later. The metal layers 11A and 11B are formed between the substrate 10 and the mesa 17 in contact with the substrate 10 and the mesa 17, respectively. The metal layer 11A has a structure in which an gold (Au)-germanium (Ge) alloy, nickel (Ni) and gold (Au) are stacked in order from the substrate 10 side, for example, and is electrically connected to the substrate 10. The metal layer 11B has a structure in which titanium (Ti), platinum (Pt) and gold (Au) are stacked in this order, for example, and is electrically connected to the lower DBR layer 12.

The lower DBR layer 12 is formed by alternately stacking a low-refractive index layer (not illustrated) and a high-refractive index layer (not illustrated). The low-refractive index layer is made of a p-type $Al_{x1}Ga_{1-x1}As$ ($0<x1<1$) of a thickness $\lambda_0/4n_1$ ($\lambda_0$ is an oscillation wavelength and $n_1$ is a refractive index), for example. The high-refractive index layer is made of a p-type $Al_{x2}Ga_{1-x2}As$ ($0<x2<x1$) of a thickness of $\lambda_0/4n_2$ ($n_2$ is a refractive index), for example. Examples of the p-type impurity include zinc (Zn), magnesium (Mg) and beryllium (Be).

The lower spacer layer 13 is made of a p-type $Al_{x3}Ga_{1-x3}As$ ($0<x3<1$), for example. The active layer 14 is made of an undoped $Al_{x4}Ga_{1-x4}As$ ($0<x4<1$), for example. In the active layer 14, a region opposed to a current injection region 18A to be described later is a light emitting region 14A. The upper spacer layer 15 is made of an n-type $Al_{x5}Ga_{1-x5}As$ ($0\leq x5<1$), for example.

The upper DBR layer 16 is formed by alternately stacking a low-refractive index layer (not illustrated) and a high-refractive index layer (not illustrated). The low-refractive index layer is made of an n-type $Al_{x6}Ga_{1-x6}As$ ($0<x6<1$) of a thickness $\lambda_0/4n_3$ ($n_3$ is a refractive index), for example. The high-refractive index layer is made of an n-type $Al_{x8}Ga_{1-x7}As$ ($0<x7<x6$) of a thickness of $\lambda_0/4n_4$ ($n_4$ is a refractive index), for example. A contact layer (not illustrated) made of an n-type $Al_{x8}Ga_{1-x8}As$ ($0<x8<1$) may further be provided upon the upper DBR layer 16, for example.

Moreover, in the semiconductor laser 1, a current narrowing layer 18 is formed in the lower DBR layer 12, for example. In the lower DBR layer 12, the current narrowing layer 18 is formed in place of the low-refractive index layer, which is disposed away from the active layer 14 by several layers from the active layer 14 side, for example. The current narrowing layer 18 includes a current confinement region 18B disposed at its outer edge region and a current injection region 18A disposed in its center region. The current injection region 18A is made of an n-type $Al_{x9}Ga_{1-x9}As$ ($0<x9\leq 1$), for example. The current confinement region 18B is configured to include an aluminum oxide ($Al_2O_3$) for example, and is obtained by oxidizing a highly concentrated aluminum contained in a layer to be oxidized 18D from side face as described later. Thereby, the current narrowing layer 18 has a function of narrowing the current. Alternatively, the current narrowing layer 18 may be formed in the inside of the upper DBR layer 16, or between the lower spacer layer 13 and the lower DBR layer 12, or between the upper spacer layer 15 and the upper DBR layer 16, for example.

An upper electrode 21 is formed on the top surface of the mesa 17. The upper electrode 21 has an annular shape including an aperture (light emitting aperture 21A) in a portion facing the current injection region 18A. The shape of the upper electrode 21 is not limited to annular shape unless the portion facing the current injection region 18A is not blocked. An insulating layer 22 is formed over the side face of the mesa 17 and periphery of the mesa 17. An electrode pad 23 for bonding wires (not illustrated) and a connecting portion 24 are formed on the surface of the insulating layer 22. The electrode pad 23 and the upper electrode 21 are electrically connected each other through the connecting portion 24. A lower electrode 25 is disposed on the bottom surface of the substrate 10.

The insulating layer 22 is made of an insulating material such as oxide or nitride, for example. The upper electrode 21, the electrode pad 23, and the connecting portion 24 have a structure in which a gold (Au)-germanium (Ge) alloy, nickel (nickel), and gold (Au) are stacked in this order, for example, and are electrically connected to an upper part of the mesa 17 (the upper DBR layer 16). The lower electrode 25 has a structure in which a gold (Au)-germanium (Ge) alloy, nickel (nickel), and gold (Au) are stacked in order from the substrate 10 side, for example, and is electrically connected to the substrate 10.

Details of the mesa 17 will be described hereinbelow.

As illustrated in FIGS. 3 and 4, a columnar portion 17A (first columnar portion), which is located in the middle of the mesa 17, includes the upper part of lower DBR layer 12, the lower spacer layer 13, the active layer 14, the upper spacer layer 15, the lower part of the upper DBR layer 16, and the current narrowing layer 18 to be described later. Here, FIGS. 3 and 4 illustrate the case where the lower DBR layer 12 includes the current narrowing layer 18. In this configuration, in the lower DBR layer 12, a portion of the current narrowing layer 18 and above belong to the columnar portion 17A.

The columnar portion 17A further includes an oxidized narrowed layer for generating parasitic capacitance in the mesa 17 and a pn junction portion. Here, the oxidized narrowed layer means what has been formed by selectively oxidizing a semiconductor layer that includes Al etc. in high concentration, for example. Therefore, in the embodiment, the current narrowing layer 18 corresponds to the oxidized narrowed layer. Meanwhile, the pn junction portion is an interface where a p-type semiconductor layer and an n-type semiconductor layer are in contact with each other. Accordingly, in the embodiment, when the lower spacer layer 13 and the upper spacer layer 15 are made of a semiconductor that includes many n-type or p-type impurities, the interfaces between the lower spacer layer 13 and the active layer 14, and between the upper spacer layer 15 and the active layer 14 correspond to the pn junction portion. Moreover, in the embodiment, when the lower spacer layer 13 and the upper spacer layer 15 are made of an undoped semiconductor, the interfaces between the lower DBR layer 12 and the lower spacer layer 13, and between the upper DBR layer 16 and the upper spacer layer 15 correspond to the pn junction portion.

Figure 5A:
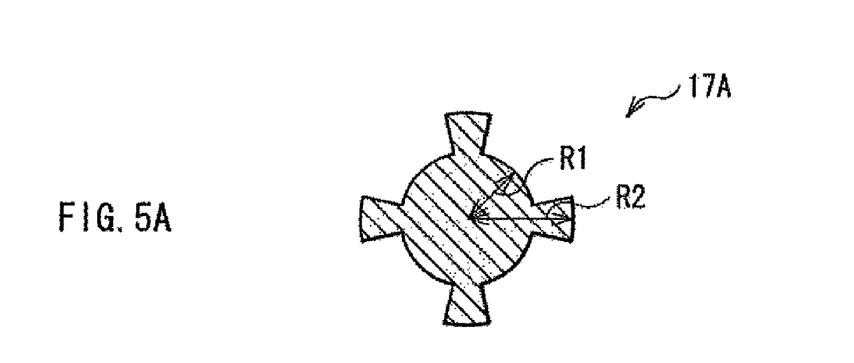
FIGS. 5A to 5C are sectional views of a mesa of FIG. 2 in a middle part, a lower part and an upper part thereof.

As illustrated in FIG. 5A, the columnar portion 17A has a gear-shaped cross section in which a portion of the radius $R_1$ and a portion of the radius $R_2$ are arranged alternately in the direction rotative about the central axis AX of the mesa 17 (the axis extending in the stack direction), for example. Preferably, the cross sectional shape of the columnar portion 17A is symmetrical with respect to the central axis AX. Here, the radius $R_1$ is smaller than the radius $R_2$, and also smaller than the radius $R_4$ of the columnar portion 17B of the mesa 17, the radius $R_5$ of the columnar portion 17C of the mesa 17, and the outer diameter $R_6$ of the upper electrode 21 to be described later. Furthermore, the radius $R_1$ is equal to the radius $R_3$ of the columnar portion 17B of the mesa 17, which will be described later. The radius $R_2$ is equal to the radius $R_4$ of the columnar portion 17B and the radius $R_5$ of the columnar portion 17C of the mesa 17, and is larger than the outer diameter $R_6$ of the upper electrode 21. Here, the radius $R_1$ and the radius $R_3$ are in the order of 7.5 μm, for example, and the radius $R_2$, the radius $R_4$ and the radius $R_5$ are in the order of 15 μm, for example.

$$R_1=R_3<R_6<R_2=R_4=R_5$$

As illustrated in FIGS. 3 and 4, the columnar portion 17B (the second columnar portion) located in the lower part of the mesa 17 includes the middle part and bottom part of the lower DBR layer 12. That is, the columnar portion 17B includes the lower DBR layer 12 that generates electric resistance in the mesa 17. Here, FIGS. 3 and 4 illustrate an example where the lower DBR layer 12 includes the current narrowing layer 18. In this configuration, a portion of the lower DBR layer 12 below the current narrowing layer 18 is included in the columnar portion 17B of the mesa 17.

Figure 5B:
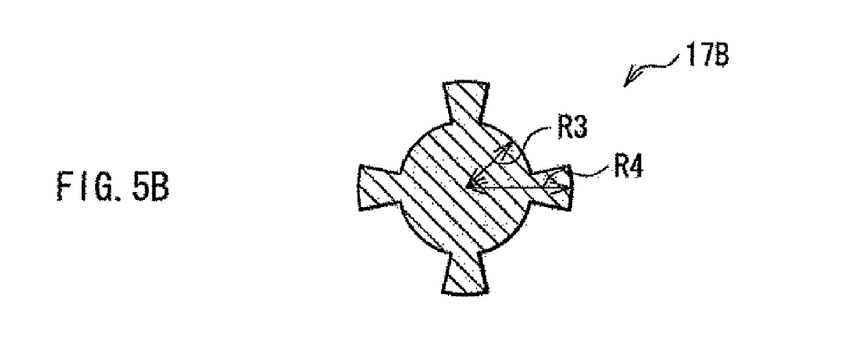

As illustrated in FIG. 5B, the columnar portion 17B has a gear-shaped cross section in which a portion corresponding to the radius $R_3$ and a portion corresponding to the radius $R_4$ are arranged alternately in the direction rotative about the central axis AX of the mesa 17, for example. Preferably, the cross sectional shape of the columnar portion 17B is symmetrical with respect to the central axis AX. Here, the radius $R_3$ is smaller than the radius $R_4$, and also smaller than the radius $R_2$, the radius $R_5$ and the outer diameter $R_6$. Furthermore, the radius $R_3$ is equal to the radius R1. The radius $R_2$ is equal to the radius $R_4$ and the radius $R_5$, and larger than the outer diameter $R_6$.

As illustrated in FIGS. 3 and 4, the columnar portion 17C (the third columnar portion) located in the upper part of the mesa 17 includes the middle portion and upper portion of the upper DBR layer 16. That is, the upper DBR layer 16 that generates electrical resistance in the mesa 17 is included in the columnar portion 17C. Preferably, the cross sectional shape of the columnar portion 17C is symmetrical with respect to the central axis AX.

Figure 5C:
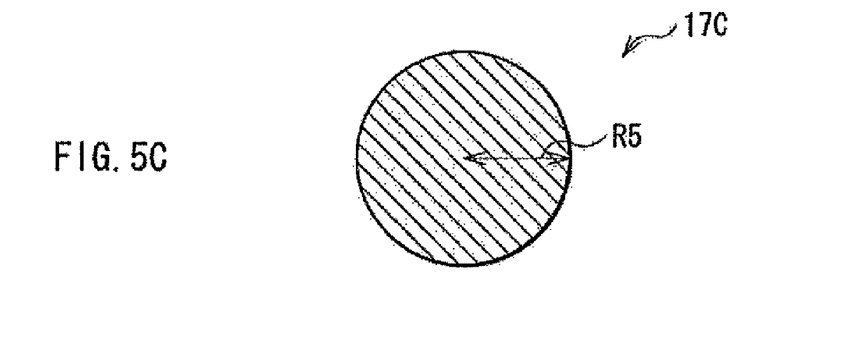

The columnar portion 17C has a circular cross section with the radius $R_5$ for example, as illustrated in FIG. 5C. Here, the radius $R_5$ is larger than the radius $R_1$, the radius $R_3$ and the outer diameter $R_6$, and equal to the radius $R_2$ and the radius $R_4$. It is thus concluded that the cross-sectional areas of the columnar portion 17A and the columnar portion 17B are equal to each other, and are smaller than the cross-sectional area of the columnar portion 17C.

A plurality of grooves 19 whose depth reaches at least the lower DBR layer 12 and the current narrowing layer 18 are formed on the side faces (surrounding) of the mesa 17. The plurality of grooves 19 are formed at a predetermined interval in the direction rotative about the mesa 17. A bridge girder portion 17E is formed between each two of the adjacent grooves 19 in such a manner as to extend radially from the side face (side face of the lower DBR layer 12) of the mesa 17. Preferably, the plurality of grooves 19 are each formed at a portion of the same distance from the central axis AX of the mesa 17, and also preferably, are symmetrical with respect to the central axis AX of the mesa 17. When the plurality of grooves 19 are formed symmetrically with respect to the central axis AX, the mesa 17 is also formed symmetrically with respect to the central axis AX. Here, the plurality of grooves 19 are formed to satisfy the following expression:

$$D_2<D_1*2$$

Figure 6:
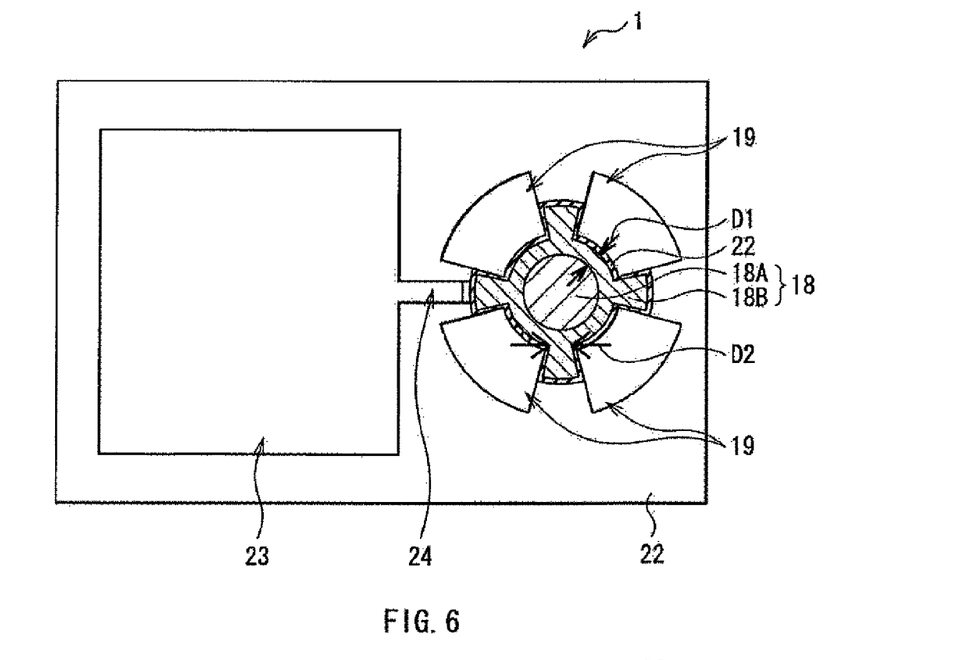
FIG. 6 is a sectional view of the current narrowing layer of FIGS. 3 and 4.

Here, $D_1$ is a radial dimension of the current confinement region 18B as measured from the inner side face of the groove 19, as illustrated in FIG. 6 for example. $D_2$ is the distance between each two of the adjacent grooves 19 among the plurality of grooves 19, which are arranged in the direction rotative about the mesa 17 (central axis AX) as illustrated in FIG. 6, for example. Here, FIG. 6 is an example of cross sectional configuration of the semiconductor laser 1 of FIG. 1 when it is transversely cut along a plane passing through the current narrowing layer 18.

It is to be noted that although explanation of the mesa 17 is given in three parts thereof, the mesa 17 is formed integrally (monolithically), and includes no bonded plane.

Manufacturing Method

The semiconductor laser 1 of the present embodiment may be manufactured in such a procedure as follows, for example.

Figure 9:
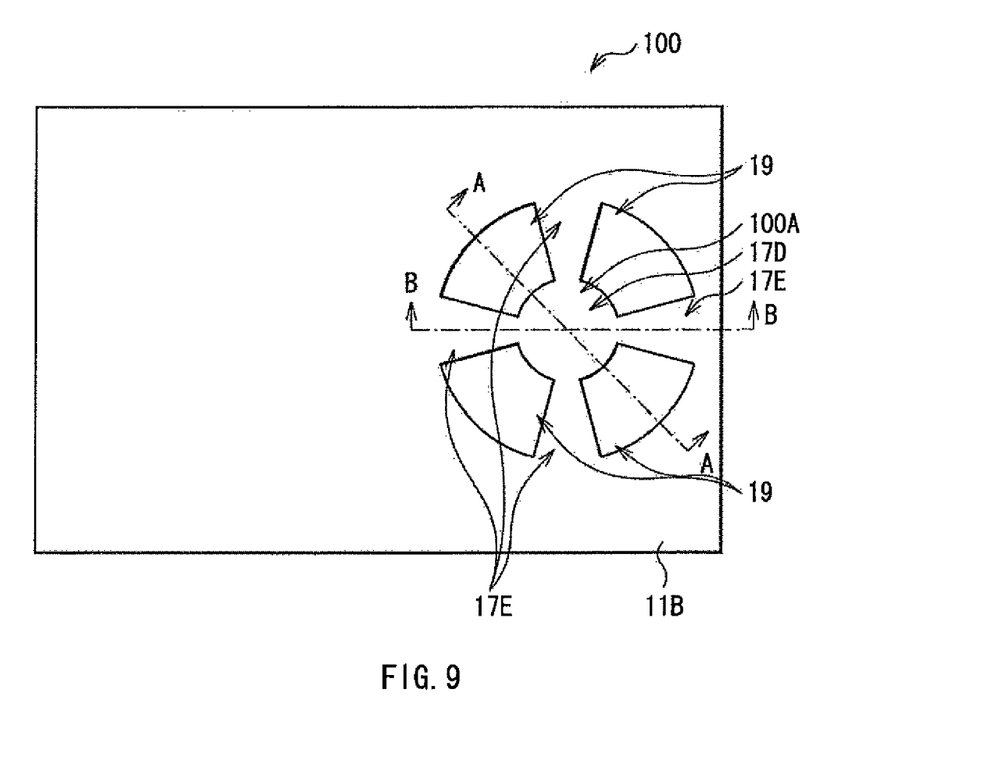
FIG. 9 is a top view to explain the manufacturing process subsequent to FIG. 7.
Figure 10:
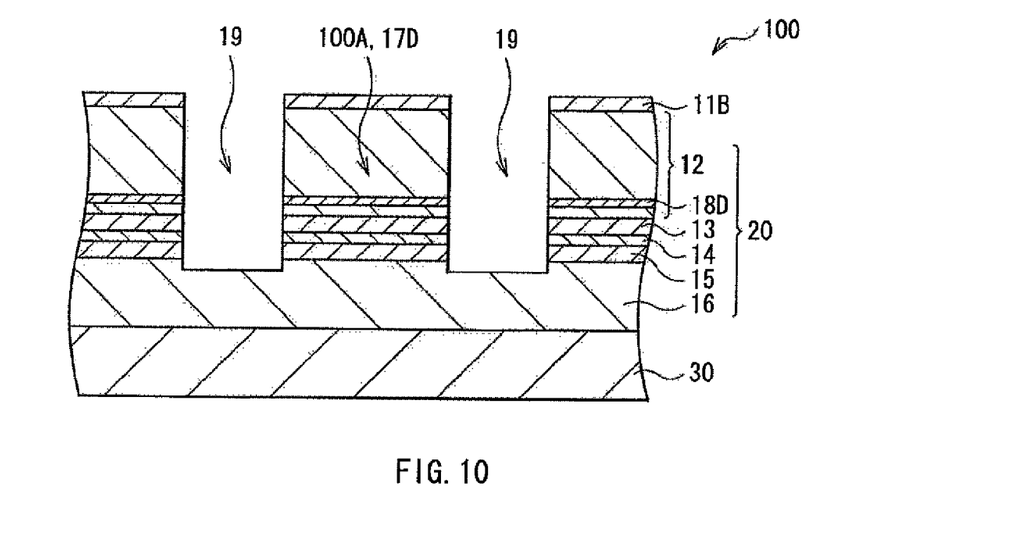
FIG. 10 is a sectional view of the substrate to be processed of FIG. 9, as seen from the direction indicated by arrows A-A.
Figure 11:
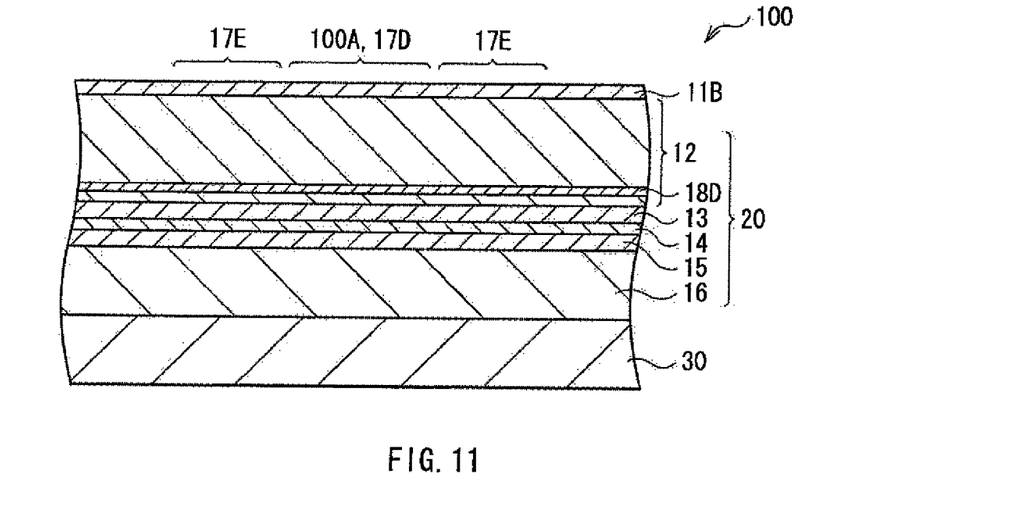
FIG. 11 is a sectional view of the substrate to be processed of FIG. 9, as seen from the direction indicated by arrows B-B.
Figure 12:
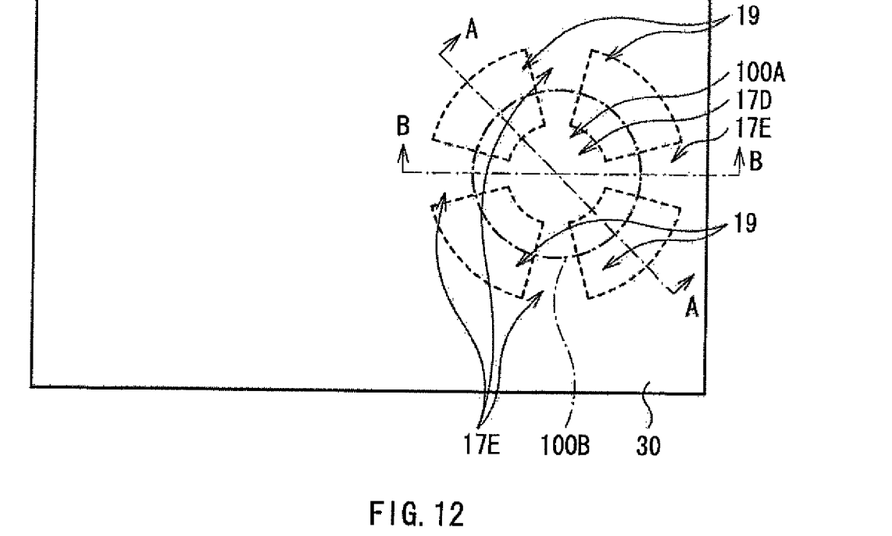
FIG. 12 is a top view to explain the manufacturing process subsequent to FIG. 9.
Figure 13:
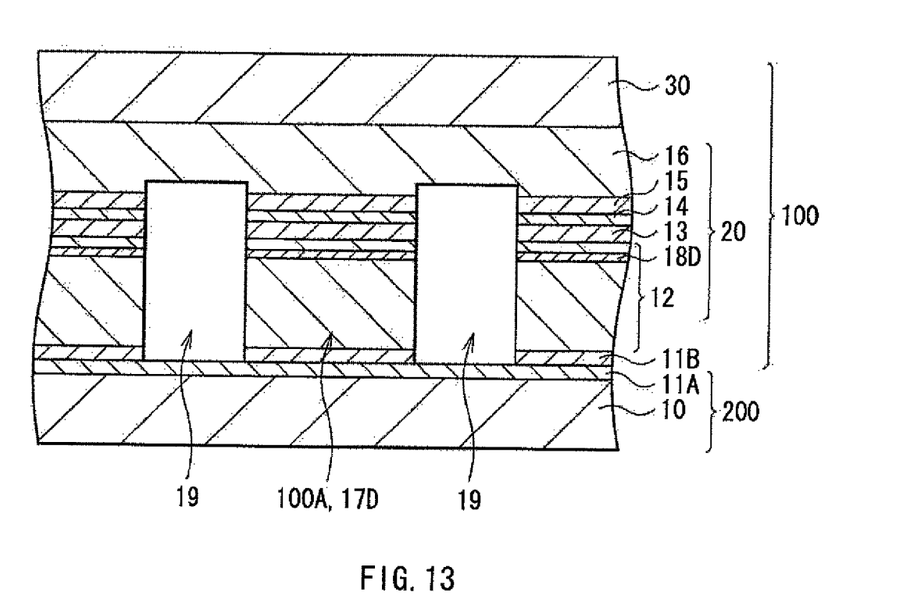
FIG. 13 is a sectional view of the substrate to be processed and a supporting substrate of FIG. 12 as seen from the direction indicated by arrows A-A.
Figure 14:
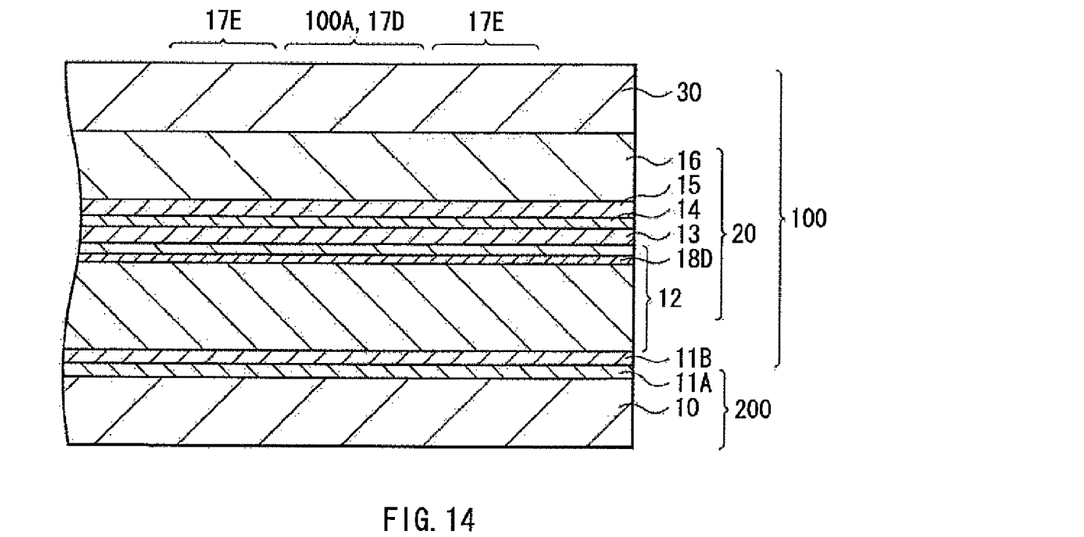
FIG. 14 is a sectional view of the substrate to be processed and the supporting substrate of FIG. 12, as seen from the direction indicated by arrows B-B.
Figure 15:
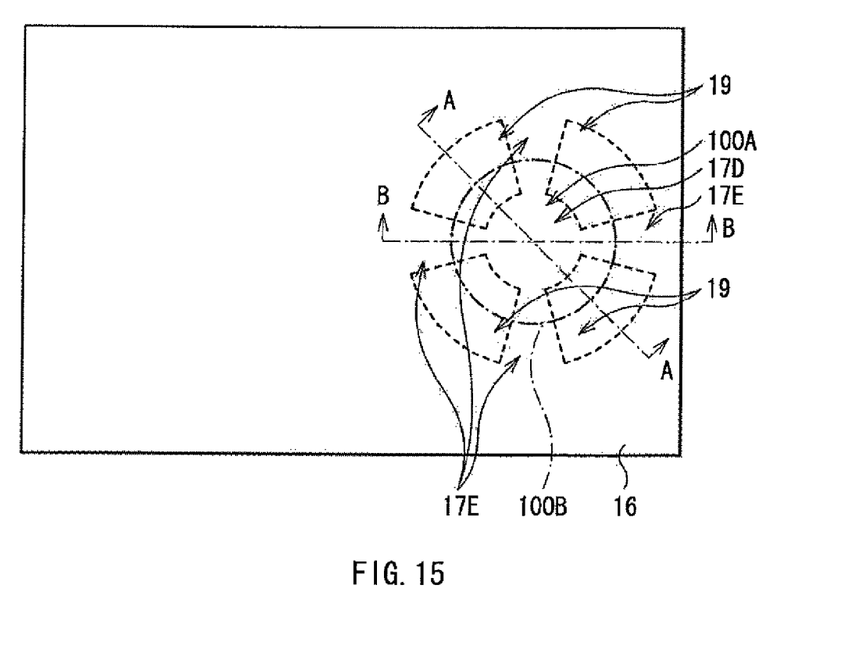
FIG. 15 is a top view to explain the manufacturing process subsequent to FIG. 12.
Figure 16:
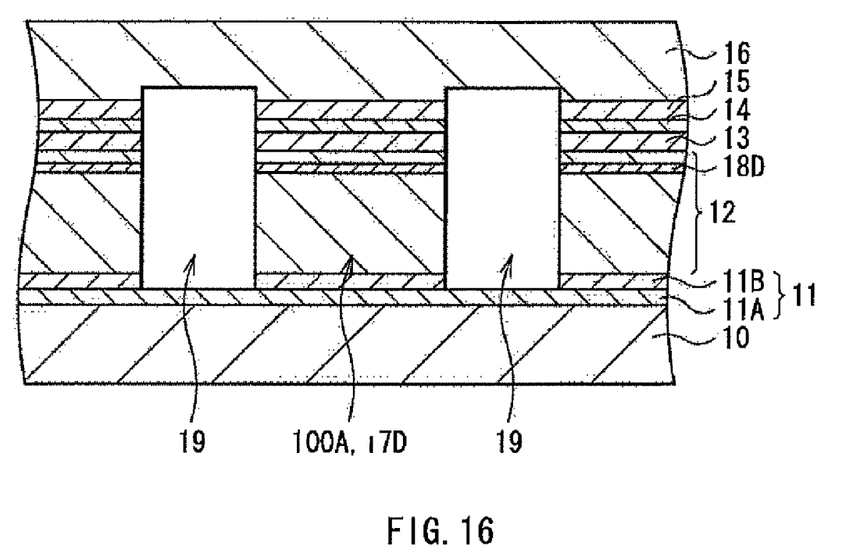
FIG. 16 is a sectional view of the substrate to be processed and the supporting substrate of FIG. 15, as seen from the direction indicated by arrows A-A.
Figure 17:
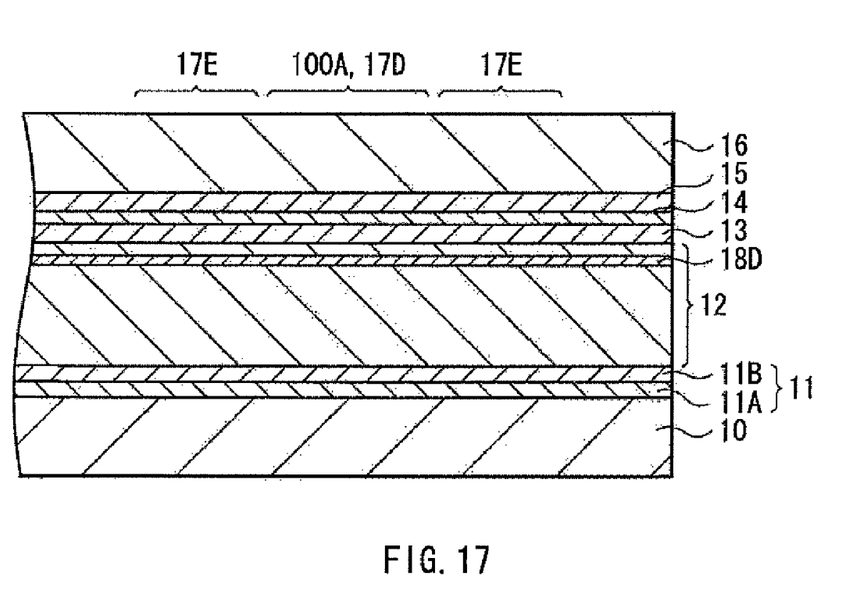
FIG. 17 is a sectional view of the substrate to be processed and the supporting substrate of FIG. 15, as seen from the direction indicated by arrows B-B.
Figure 18:
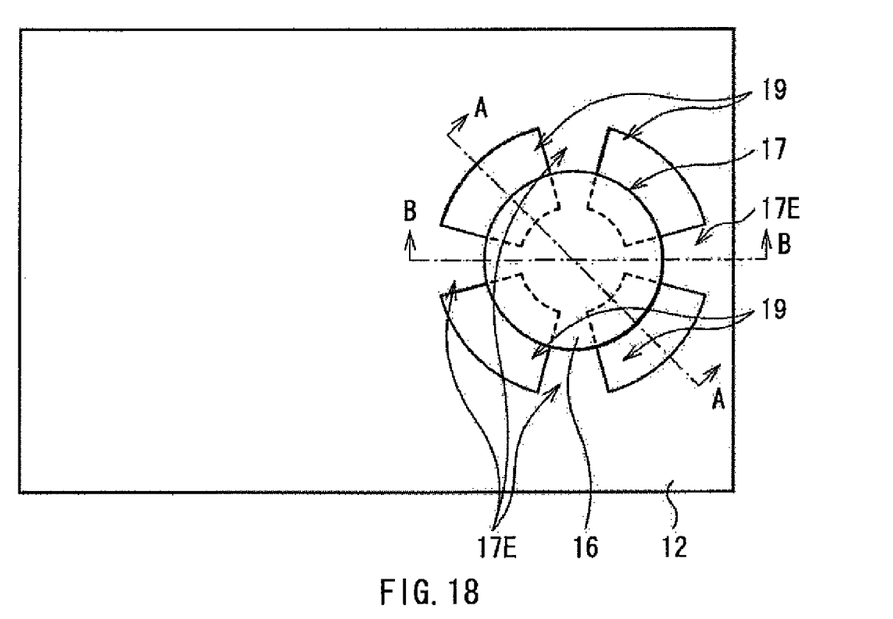
FIG. 18 is a top view to explain the manufacturing process subsequent to FIG. 15.
Figure 19:
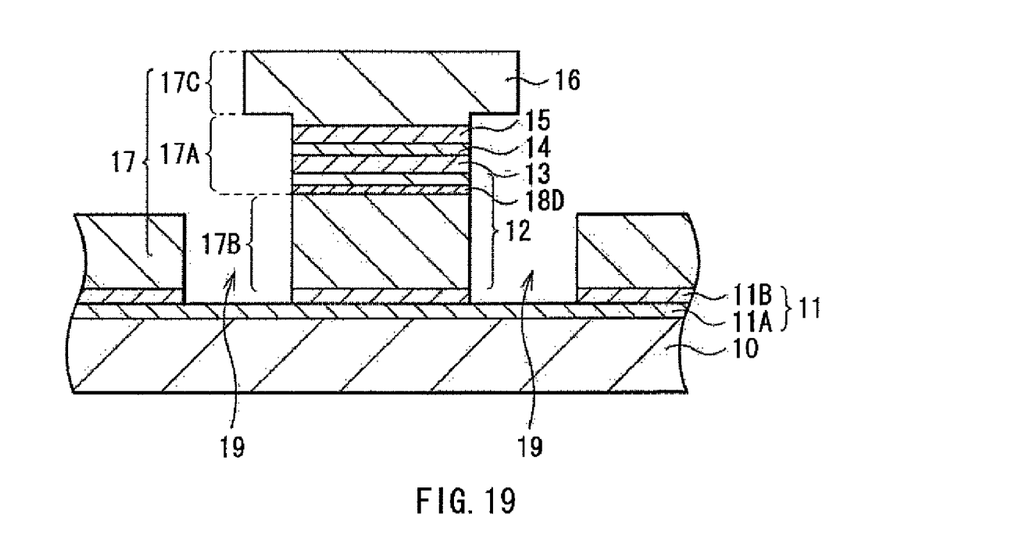
FIG. 19 is a sectional view of the substrate to be processed and the supporting substrate of FIG. 18, as seen from the direction indicated by arrows A-A.
Figure 20:
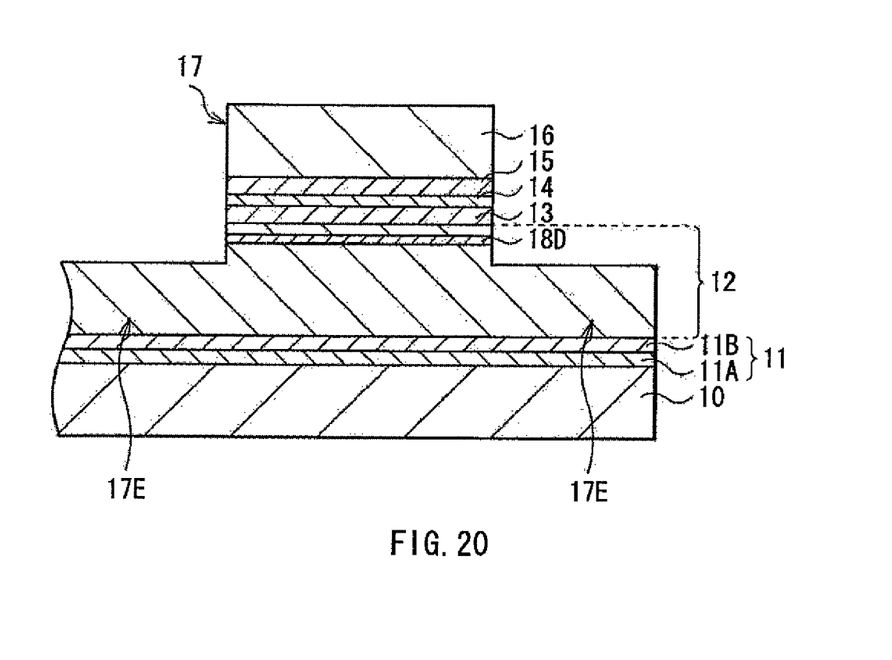
FIG. 20 is a sectional view of the substrate to be processed and the supporting substrate of FIG. 18, as seen from the direction indicated by arrows B-B.
Figure 21:
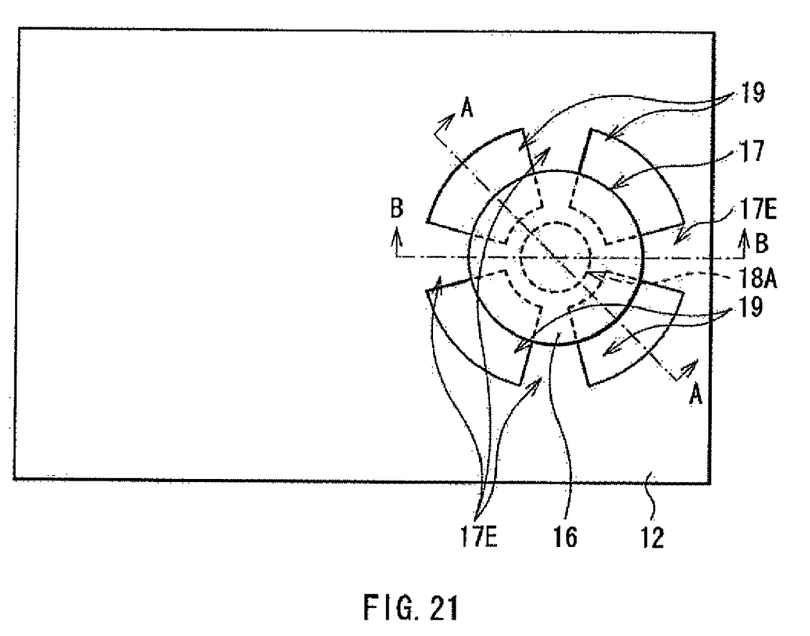
FIG. 21 is a top view to explain the manufacturing process subsequent to FIG. 18.
Figure 22:
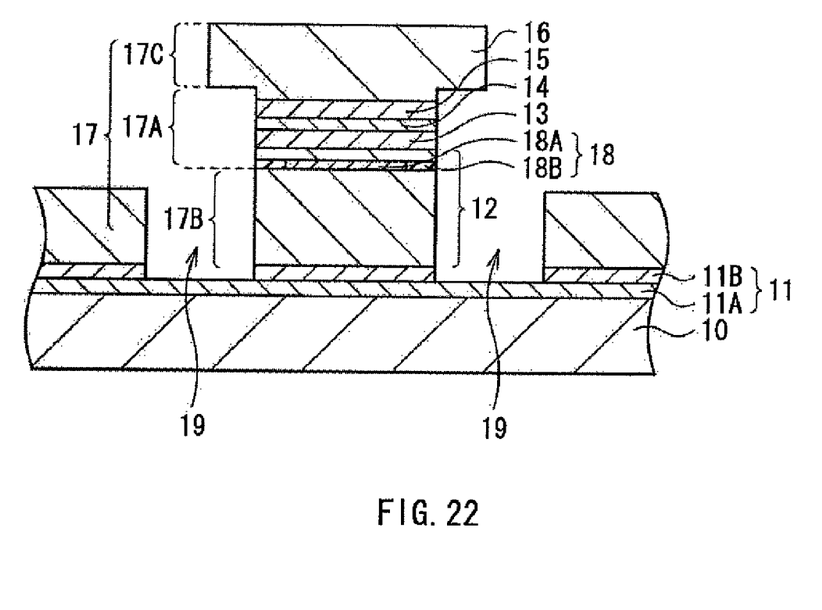
FIG. 22 is a sectional view of the substrate to be processed and the supporting substrate of FIG. 21, as seen from the direction indicated by arrows A-A.
Figure 23:
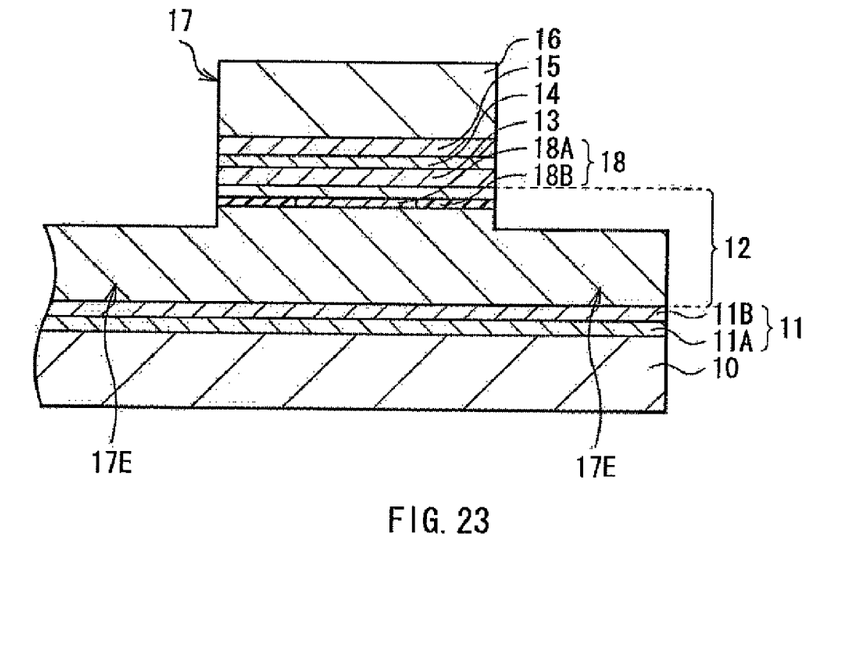
FIG. 23 is a sectional view of the substrate to be processed and the supporting substrate of FIG. 21, as seen from the direction indicated by arrows B-B.

FIGS. 7 to 23 are views illustrating the manufacturing process of the semiconductor laser 1 according to the process sequence. FIGS. 7, 9, 12, 15, 18 and 21 are top views illustrating the top surface configuration of the elements thereof in the course of the manufacturing process. FIG. 8 is a cross sectional configuration of FIG. 7 as seen from the directions indicated by arrows A-A and B-B. FIG. 10 illustrates a cross-sectional configuration of FIG. 9 as seen from the direction indicated by arrows A-A, and FIG. 11 illustrates a cross-sectional configuration of FIG. 9 as seen from the direction indicated by arrows B-B. FIG. 13 illustrates a cross-sectional configuration of FIG. 12 as seen from the direction indicated by arrows. A-A, and FIG. 14 illustrates a cross-sectional configuration of FIG. 12 as seen from the direction indicated by arrows B-B. FIG. 16 illustrates a cross-sectional configuration of FIG. 15 as seen from the direction indicated by arrows A-A, and FIG. 17 illustrates a cross-sectional configuration of FIG. 15 as seen from the direction indicated by arrows B-B. FIG. 19 illustrates a cross-sectional configuration of FIG. 18 as seen from the direction indicated by arrows A-A, and FIG. 20 illustrates a cross-sectional configuration of FIG. 18 as seen from the direction indicated by arrows B-B. FIG. 22 illustrates a cross-sectional configuration of FIG. 21 as seen from the direction indicated by arrows A-A, and FIG. 23 illustrates a cross-sectional configuration of FIG. 21 as seen from the direction indicated by arrows B-B.

Here, a GaAs compound semiconductor layer is formed on a substrate 30 by MOCVD (metal organic chemical vapor deposition) method, for example. In this case, trimethylaluminum (TMA), trimethylgallium (TMG), trimethylindium (TMIn) and arsine (AsH3) are used as materials of the III-V group compound semiconductor, for example, and $H_2Se$ is used as a material of donor impurities, for example, and dimethyl zinc (DMZ) is used as a material of acceptor impurities, for example.

Figure 7:
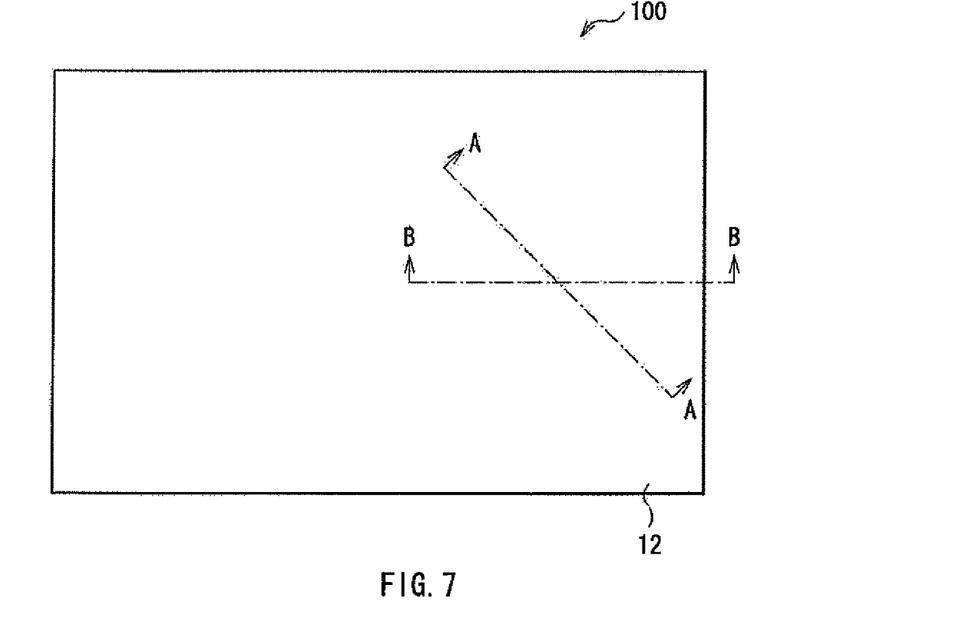
FIG. 7 is a top view to explain the manufacturing process of the laser diode of FIG. 1.
Figure 8:
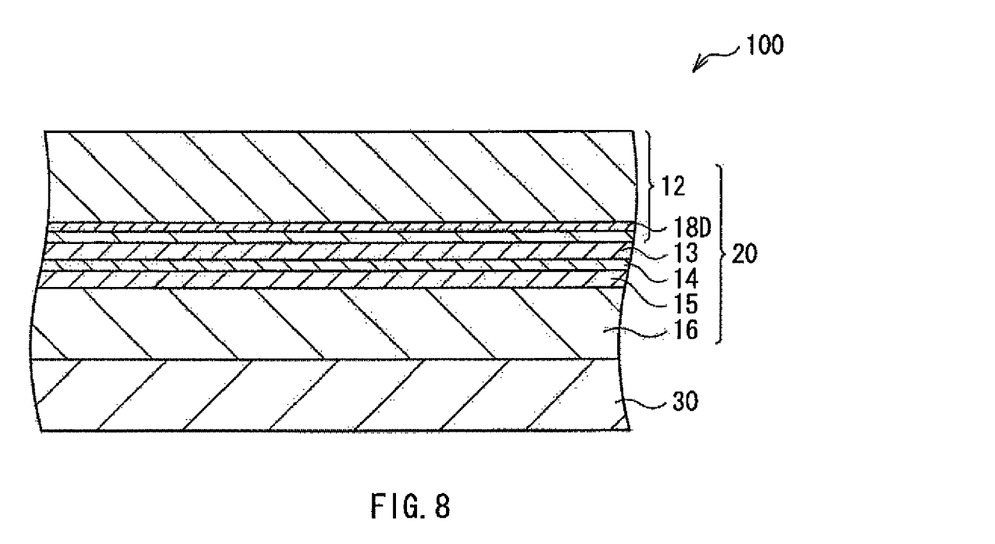
FIG. 8 is a sectional view of a substrate to be processed of FIG. 7, as seen from the directions indicated by arrows A-A and B-B.

Specifically, a substrate to be processed 100 having a stack structure 20 is first formed on the substrate 30 as illustrated in FIGS. 7 and 8. The stack structure 20 includes the upper DBR layer 16, the upper spacer layer 15, the active layer 14, the lower spacer layer 13 and the lower DBR layer 12 in this order. At this time, the layer to be oxidized 18D is formed in a part of the lower DBR layer 12, for example. The layer to be oxidized 18D is a layer which turns into the current narrowing layer 18 through oxidation process to be described later, and is configured to include AlAs.

Subsequently, a resist layer (not illustrated) is formed in the periphery of the columnar specific region 100A in the stack structures 20 (a region which will turn into the mesa 17D in subsequent manufacturing process) to have a plurality of apertures therein at a predetermined interval in the direction rotative about the specific region 100A. Subsequently, the upper part of the lower DBR layer 12, the lower spacer layer 13, the active layer 14, the upper spacer layer 15, and the upper DBR layer 16 are selectively removed by RIE (reactive ion etching), by using the resist layer as a mask. In this manner, the plurality of grooves 19 each reaching at least the upper DBR layer 16 and the layer to be oxidized 18D are formed as illustrated in FIGS. 9, 10 and 11. At this time, the plurality of grooves 19 are formed to satisfy the above-mentioned expression ($D_2 < D_1*2$). Preferably, the plurality of grooves 19 are formed symmetrically with respect to the axis extending in the stack direction in the above-mentioned process. Also, the columnar mesa 17D is formed in the specific region 100A surrounded by the plurality of grooves 19, and the bridge girder portions 17E extending radially from the side face of the mesa 17D are formed in the above-mentioned process. The bridge girder portions 17E are formed between each two of the adjacent grooves 19 among the plurality of grooves 19, which are arranged in the direction rotative about the mesa 17D. Then, the resist layer is removed.

Subsequently, the metal layer 11B is formed to serve as a bonding metal in subsequent process on the top surface plane of the substrate to be processed 100 where the grooves 19 are not formed, that is, on the surface of the lower DBR layer 12, as illustrated in FIGS. 9, 10 and 11. Subsequently, the supporting substrate 200 having the metal layer 11A on the substrate 10 is prepared, and the metal layer 11B of the substrate to be processed 100 is bonded together to the metal layer 11A of the supporting substrate 200 as illustrated in FIGS. 12, 13 and 14. Then, the substrate 30 is removed as illustrated in FIGS. 15, 16 and 17. To prevent the upper DBR layer 16 from being removed together with the removal of the substrate 30, an etching stop layer etc., may be provided between the substrate 30 and the upper DBR layer 16.

Subsequently, the whole or a part of a portion other than the region including the specific region 100A is removed from the upper DBR layer 16 side. Specifically, a resist layer (not illustrated) is first formed to cover the region including the specific region 100A (the mesa 17D) in the stack structures 20. For example, a resist layer (not illustrated) is formed to cover a circular region 100B (see FIG. 15) that includes whole of the specific region 100A (mesa 17D) and one-end portions of the bridge girder portions 17E on the side near the specific region 100A (mesa 17D). Then, the upper part of the upper DBR layer 16, the upper spacer layer 15, the active layer 14, the lower spacer layer 13, and the lower DBR layer 12 are selectively removed by RIE, for example, by using the resist layer as a mask. In this manner, a lower-constricted mesa 17 where the cross-section areas of the columnar portion 17C (portion of the upper DBR layer 16) is larger than the cross-section area of the columnar portion 17A and the columnar portion 17B is formed with the grooves 19 communicating with outside, as illustrated in FIGS. 18, 19 and 20. Here, a portion of the bridge girder portions 17E left unetched through etching process corresponds to the portion of the radius $R_2$ of the columnar portions 17A and the portion of the radius $R_4$ of the columnar portion 17B.

In the above-mentioned process, it is not necessary to remove the stack structure 20 entirely other than the region 100B. For example, only the peripheral area of the region 100B (annular region surrounding the region 100B) may be removed from the upper DBR layer 16 to an upper portion of the lower DBR layer 12 so that the grooves 19 are communicate with outside and the lower-constricted mesa 17 is formed.

Subsequently, oxidation treatment is performed in a water-vapor atmosphere at high temperature to selectively oxidize aluminum contained in the layer to be oxidized 18D from the side face of the mesa 17 (side face of the grooves 19). As a result, in the mesa 17, the fringe region of the layer to be oxidized 18D becomes the current confinement region 18B by oxidation and the other unoxidized region of the layer to be oxidized 18D becomes the current injection region 18A as illustrated in FIGS. 21, 22 and 23.

Subsequently, the insulating layer 22 made of an insulating inorganic material such as silicon oxide ($SiO_2$) is formed to cover all the surface plane, for example. Subsequently, a resist layer (not illustrated) is formed on the surface plane of the mesa 17 in such a manner as to have an annular opening surrounding the area opposed to the current injection region 18A, and thereafter, the insulating layer 22 is selectively removed by using the resist layer as a mask by RIE, for example. In this manner, an annular opening is formed in the insulating layer 22 in a portion opposed to the current injection region 18A. Then, the resist layer is removed.

Subsequently, the foregoing metal material is stacked on the whole surface plane by vacuum evaporation method, for example. Then, the annular upper electrode 21, which has the light emitting aperture 21A in the region opposed to the current injection region 18A and also has its outer edge portion partially extended outside of the region opposed to the specific region 100A (the columnar portions 17A and 17B) by selective etching, for example. In addition, the electrode pad 23 is formed on the insulating layer 22 in the periphery of the mesa 17. Furthermore, the connecting portion 24 is formed between the upper electrode 21 and the electrode pad 23 (see FIG. 2). Furthermore, the lower electrode 25 is formed on the rear face of the substrate 10 after polishing the rear face of the substrate 10 to adjust its thickness (see FIG. 2). In this manner, the semiconductor laser 1 according to the present embodiment is manufactured.

Subsequently, operations and effects of the semiconductor laser 1 according to the present embodiment will be hereinafter described.

Operation and Effect

In the semiconductor laser 1 of the present embodiment, when a predetermined voltage is applied between the lower electrode 25 and the upper electrode 21, current is injected into the active layer 14 through the current injection region 18A in the current narrowing layer 18 to recombine electrons and holes, thereby emitting a light. The light is reflected by the lower DBR layer 12 and the upper DBR layer 16 to produce a laser oscillation at a predetermined wavelength, and is emitted outside through the emitting aperture 21A as a laser beam.

In the embodiment, the columnar portion 17A of the mesa 17 including the active layer 14 and the current narrowing layer 18 is formed within the region opposed to the lower DBR layer 12 and the upper DBR layer 16, as illustrated in FIGS. 3 and 4. Furthermore, as illustrated in FIGS. 5A, 5B and 5C, the cross-section area of the columnar portion 17A is smaller than the cross-section area of the columnar portion 17C (upper DBR layer 16). Accordingly, the parasitic capacitance caused by the presence of the active layer 14 and the current narrowing layer 18 is allowed to be reduced. Moreover, electrical resistance in the mesa is reduced and power consumption is suppressed compared with the case where the diameter of the entire mesa is decreased. Accordingly, in the present embodiment, parasitic capacitance is reduced while suppressing power consumption.

Moreover, in the manufacturing method of the present embodiment, the supporting substrate 200 is bonded to a surface plane of the substrate to be processed 100 on the side toward which each groove 19 is opened. Here, the substrate to be processed 100 includes the stack structure 20 on the substrate 10, and the grooves 19 are formed at a predetermined interval around the specific region 100A. Then, the region other than the region 100B including the specific region 100A is entirely or partially removed from the substrate 10 side, thereby allowing the grooves 19 to communicate with outside. At this time, the columnar portion 17A is formed within a region opposed to the columnar portion 17B and within a region opposed to the columnar portion 17C. Furthermore, the cross-section area of the columnar portion 17A becomes smaller than the cross-section area of the columnar portion 17C.

Here, the diameter of the specific region 100A (mesa 17D) is determined in a process previous to the process of allowing the grooves 19 to communicate with outside, thus it is not limited by the diameter of the unremoved region 100B in the groove communication process. Accordingly, the cross-section area of the columnar portion 17A is allowed to be decreased irrespective of the columnar portion 17C (upper DBR layer 16), and the parasitic capacitance caused by the columnar portion 17A is thereby reduced. In addition, since the cross-section area of the columnar portion 17C is kept larger irrespective of the columnar portion 17A, the electrical resistance in the mesa is reduced and power consumption is suppressed compared with the case where the diameter of the entire mesa is small. Thus, in the embodiment, parasitic capacitance is reduced easily while suppressing power consumption.

Further, in the manufacturing method of the present embodiment, the mesa 17 is formed integrally (monolithically) and there is no bonded portion in the mesa 17. In this configuration, the optical film thickness in the mesa 17 is controlled strictly by crystal growth, thus occurrence of optical positional shift due to a bonding is avoidable.

Modification

The present invention has been described with reference to the embodiment as mentioned above, but it is not limited to this and various modifications are obtainable.

For example, in the above-mentioned embodiment, although the AlGaAs-based compound semiconductor laser is exemplarily employed to explain the present invention, it is applicable to other types of compound semiconductor lasers. Moreover, in the above-mentioned embodiment, although the description is made as to the case in which the invention is applied to the top-emitting type semiconductor laser, it is also applicable to a bottom-emitting type semiconductor laser.

In addition, although the conductive type of the semiconductor is exemplified in the above-mentioned embodiment, the conductivity type may be reversed. For example, in the above-mentioned embodiment, portions denoted by "p-type" may be changed by "n-type", and portions denoted by "n-type" may be changed by "p-type".

The present application contains subject matter related to that disclosed in Japanese Priority Patent Application JP2009-026675 filed in the Japan Patent Office on Feb. 6, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A vertical cavity surface emitting laser, comprising:
a columnar mesa including, on a substrate, a first multilayer reflector, an active layer, and a second multilayer reflector in order from the substrate side, and also including a current narrowing layer, wherein
a columnar portion of the mesa including the active layer and the current narrowing layer is formed within a region opposed to the first multilayer reflector and a region opposed to the second multilayer reflector,
a cross section area of the columnar portion is smaller than a cross section area of the second multilayer reflector, and
an annular electrode having a light emitting aperture on a top surface of the mesa,
wherein a side face of the columnar portion is partially positioned inside an outer edge of the electrode.

2. The vertical cavity surface emitting laser according to claim 1, wherein the mesa is formed symmetrically with respect to an axis extending in a stack direction.

3. The vertical cavity surface emitting laser according to claim 1, wherein the mesa is formed monolithically.

4. The vertical cavity surface emitting laser according to claim 3, wherein a metal layer is disposed between the substrate and the mesa to be in contact with the substrate and the mesa.

5. The vertical cavity surface emitting laser according to claim 4, wherein the metal layer includes a first metal layer and a second metal layer bonded to each other.

* * * * *